United States Patent
Ma

(10) Patent No.: US 7,121,844 B2
(45) Date of Patent: Oct. 17, 2006

(54) PICK-UP CAP FOR LAND GRID ARRAY CONNECTOR

(75) Inventor: Hao-Yun Ma, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/033,346

(22) Filed: Jan. 10, 2005

(65) Prior Publication Data

US 2005/0153582 A1    Jul. 14, 2005

(30) Foreign Application Priority Data

Jan. 8, 2004    (CN)    ..................... 20042002241565

(51) Int. Cl.
*H01R 12/00*    (2006.01)

(52) U.S. Cl. ........................ 439/73; 439/331; 439/330; 439/41

(58) Field of Classification Search .................. 439/73, 439/66, 331, 342
See application file for complete search history.

(56) References Cited

U.S. PATENT DOCUMENTS

| | | | |
|---|---|---|---|
| 5,482,471 A * | 1/1996 | Mori et al. ................. | 439/263 |
| 6,552,624 B1 * | 4/2003 | Fuerst et al. ................. | 332/106 |
| 6,561,825 B1 * | 5/2003 | McHugh et al. ............ | 439/135 |
| 6,722,909 B1 * | 4/2004 | McHugh et al. ............ | 439/331 |
| 6,735,085 B1 * | 5/2004 | McHugh et al. ............ | 361/719 |
| 6,776,625 B1 * | 8/2004 | Ma ............................. | 439/73 |
| 6,780,041 B1 * | 8/2004 | Ma ............................. | 439/342 |
| 6,799,978 B1 * | 10/2004 | Ma et al. ....................... | 439/73 |
| 6,814,604 B1 * | 11/2004 | Lee ............................. | 439/342 |
| 6,832,919 B1 * | 12/2004 | Ma et al. ....................... | 439/73 |
| 6,877,990 B1 * | 4/2005 | Liao et al. .................... | 439/41 |

* cited by examiner

*Primary Examiner*—Tulsidas C. Patel
*Assistant Examiner*—Harshad C Patel
(74) *Attorney, Agent, or Firm*—Wei Te Chung

(57) ABSTRACT

A pick-up cap (13) is provided for an LGA connector (12). The LGA connector includes a load plate (24) defining a rectangular opening (240) in a middle portion thereof and a pair of pressing portions (241) surrounding the opening. The pick-up cap defines a main body (32) and a pair of wings (34) extending from two opposite sides of the main body. A plurality of first projections (325) extends from one of the two rest sides of the main body. A resilient arm (326) extends from the other of the two rest sides of the main body. A second projection (324) is provided at two ends of the resilient arm, respectively. The pick-up cap further defines a tongue portion (35) extending from the side defining the first projections.

10 Claims, 6 Drawing Sheets

PICK-UP CAP FOR LAND GRID ARRAY CONNECTOR

BACKGROUND OF THE INVENTION

1. Field of the Invention

The present invention relates to a pick-up cap, especially to a pick-up cap for a land grid array connector.

2. Description of the Prior Art

Electronic components are often manipulated for positioning on electrical apparatus as, for example, on a printed circuit board (PCB) by means of vacuum suction nozzles. In the case of an electrical connector, vacuum pick up is typically facilitated by means of a cap which have a flat upper surface and projections extending downwardly from the upper surface to engage a medial slot or a plurality of apertures of the connector. The cap and the attached connector are picked up by a vacuum suction nozzle and then placed in an appropriate position on a PCB. After the connector as well as all other components have been positioned and attached on the PCB, the vacuum pick-up cap will be removed, usually in a manual procedure.

FIGS. 4–6 show a conventional pick-up cap 98 for a land grid array (LGA) connector 9. The LGA connector 9 comprises an insulative housing 90 accommodating a plurality of conductive contacts 93, a stiffener body 92 retaining the housing 90, a load plate 96 pivotally assembled to one end of the stiffener body 92, and a load lever 97 assembled to the other end of the stiffener body 92. The load plate 96 defines a rectangular opening 960 in a middle portion thereof and a pair of pressing portions 961 surrounding the opening 960. The pick-up cap 98 defines a main body 980 and a pair of wings 981 extending from two opposite sides of the main body 980. The main body 980 is provided with a flat and smooth upper surface for being picked up by a vacuum suction nozzle. A plurality of first projections 982 extends from one of the two rest sides of the main body 980. A resilient arm 983 extends from the other of the two rest sides of the main body 980. A second projection 984 is provided at two ends of the resilient arm 983, respectively. After the pick-up cap 98 is assembled with the load plate 96, the main body 980 of the pick-up cap 98 is partially received in the opening 960, and the two wings 981 abut against the pressing portions 961 of the load plate 96. The first and second projections 982, 984 cooperatively hook the load plate 96 via the opening 960. The resilient arm 983 is convenient for assembling the pick-up cap 98 with the load plate 96 by virtue of its flexibility. Thus, the pick-up cap 98 is attached with the load plate 96 and ready for being picked up by a vacuum suction nozzle.

When the vacuum suction nozzle presses on a middle portion of the main body 980 of the pick-up cap 98, the adsorption therebetween is stable and facile. When the vacuum suction nozzle presses on a portion adjacent to the resilient arm 983, the pick-up cap-98 will endure a torsion about an axis connecting the two wings 981. But this torsion will not tilt the pick-up cap 98 because of the hooking cooperation between the first projections 982 and the load plate 96. Therefore, when the nozzle presses on a portion adjacent to the resilient arm 983, the adsorption therebetween is still stable and facile.

However, when the nozzle presses on a portion adjacent to the first projections 982, the pick-up cap 98 will be tilted, and the portion where the nozzle presses on will be pushed down toward the contacts 93. This different result is caused by the resilient arm 983. Because the resilient arm is flexible and the second projections 984 can be divorced from the load plate 96 easily. When the nozzle presses on a portion adjacent to the first projections 982, a torsion about an axis connecting the two wings 981 will force the resilient arm 983 to divorce from the load plate 96. Thus, the pick-up cap 98 is tilted and the portion where the nozzle presses on is pushed down toward the contacts 93. Once the pick-up cap 98 is tilted, the adsorption between the nozzle and the pick-up cap 98 is failed. Moreover, the contacts 93 received in the housing 90 will be bended or damaged.

In view of the above, it is strongly desired to provide an improved pick-up cap which overcomes the above-mentioned disadvantages.

SUMMARY OF THE INVENTION

Accordingly, an object of the present invention is to provide a new pick-up cap, wherein the pick-up cap can prevent the pick-up cap from tilting on a land grid array connector when exterior forces are acted on non-middle portions of the pick-up cap.

To fulfill the above-mentioned object, a new pick-up cap for a land grid array (LGA) connector is provided according to the present invention. The LGA connector comprises an insulative housing accommodating a plurality of conductive contacts, a stiffener body retaining the housing, a load plate pivotally assembled to one end of the stiffener body, a load lever assembled to the other end of the stiffener body, and a pick-up cap attached on the load plate. The load plate defines a rectangular opening in a middle portion thereof and a pair of pressing portions surrounding the opening. The pick-up cap defines a main body and a pair of wings extending from two opposite sides of the main body. The main body is provided with a flat and smooth upper surface for being picked up by a vacuum suction nozzle. A plurality of first projections extends from one of the two rest sides of the main body. A resilient arm extends from the other of the two rest sides of the main body. A second projection is provided at two ends of the resilient arm, respectively. The pick-up cap further defines a tongue portion extending from the side defining the first projections.

After the pick-up cap is assembled with the load plate, the main body of the pick-up cap is partially received in the opening, and the two wings abut against the pressing portions of the load plate. The first and second projections cooperatively hook the load plate via the opening. The resilient arm is convenient for assembling the pick-up cap with the load plate by virtue of its flexibility. The tongue portion abuts against the load late, like the two wings abutting against the load plate. Thus, the pick-up cap is attached with the load plate and ready for being picked up by a vacuum suction nozzle.

With this configuration of the pick-up cap, when exterior forces presses on a portion adjacent to the first projections, a torsion produced accordingly is counteracted by the cooperation between the tongue portion and the load plate.

Other objects, advantages and novel features of the present invention will become more apparent from the following detailed description when taken in conjunction with the accompanying drawings, in which:

DESCRIPTION OF PREFERRED EMBODIMENT

Reference will now be made to the drawings to describe the present invention in detail.

Figure 1:
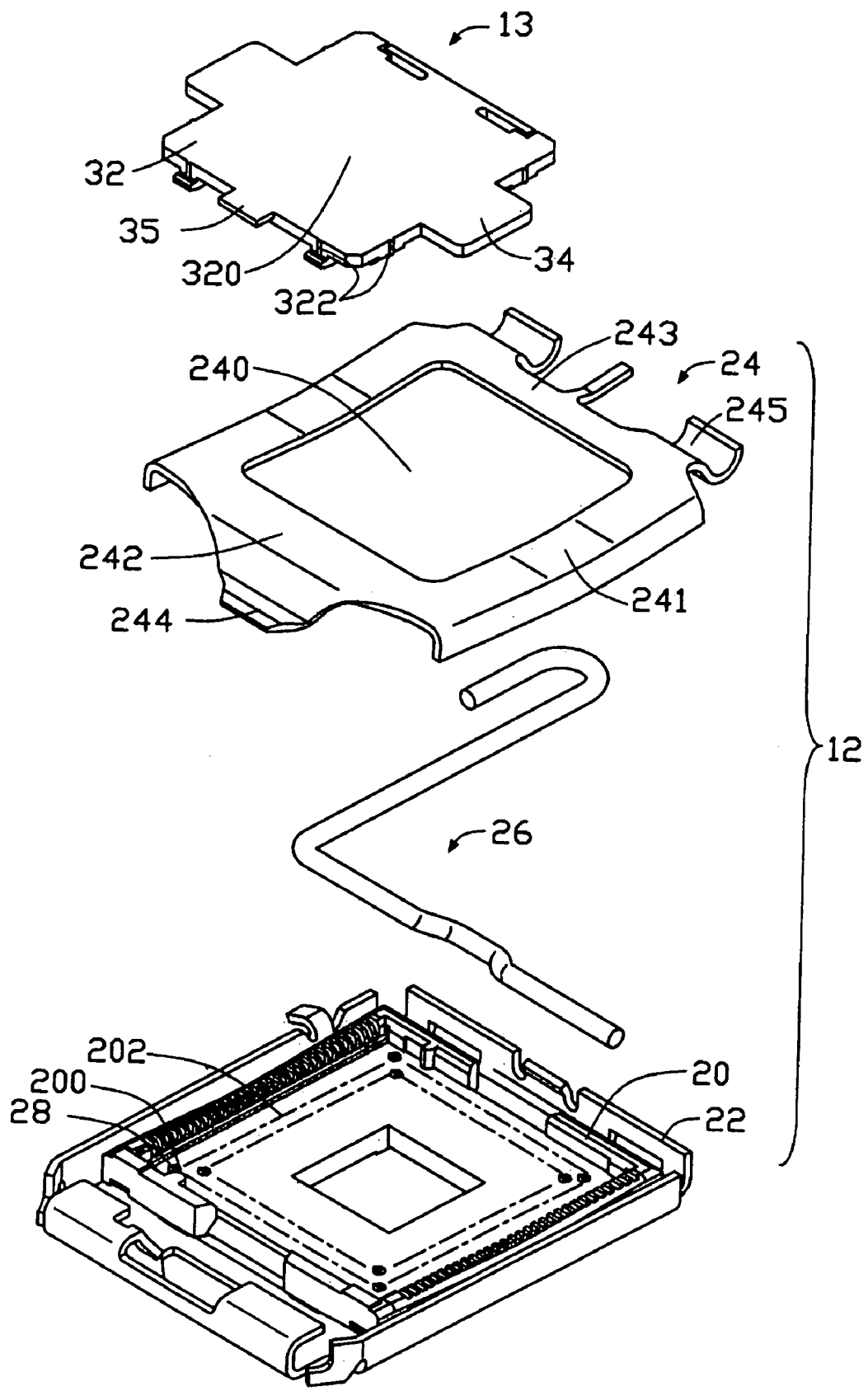
FIG. 1 is an exploded, isometric view of a pick-up cap and an LGA connector on which the pick-up cap is ready to be attached.
Figure 2:
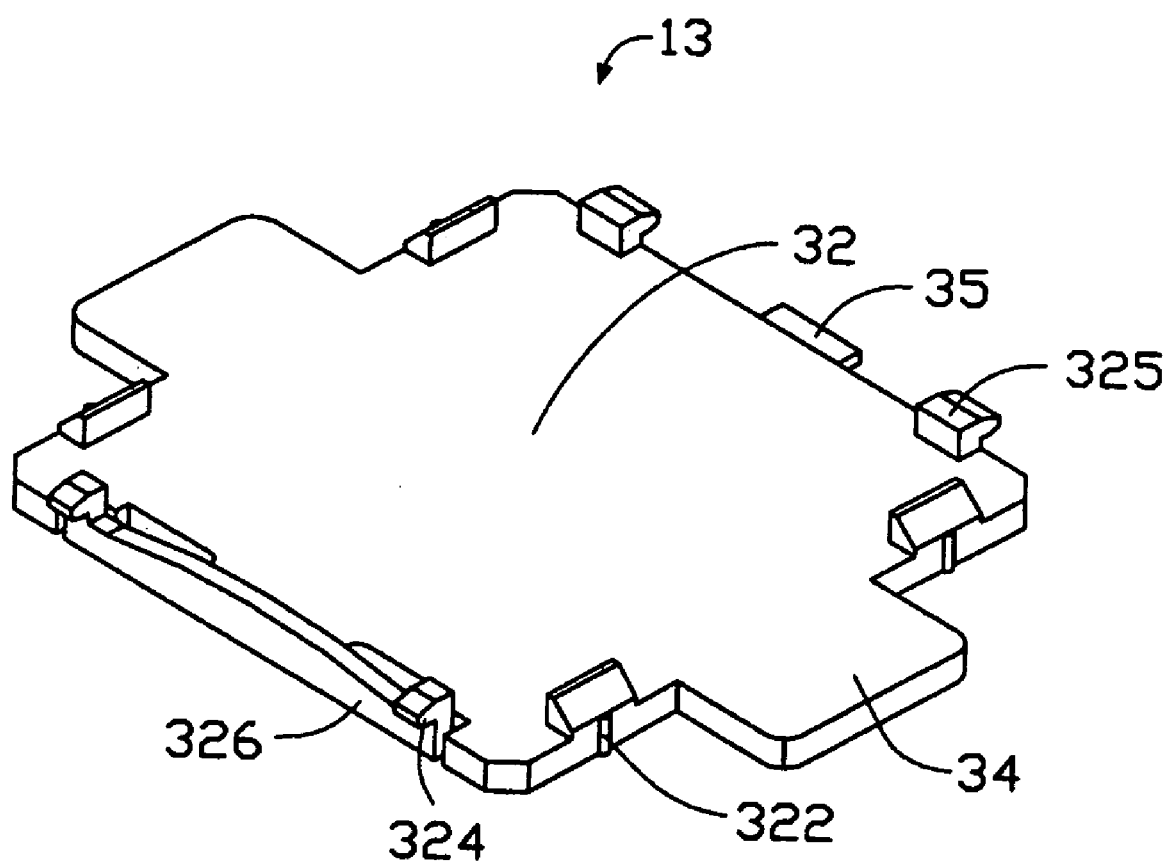
FIG. 2 is an inverted isometric view of the pick-up cap of FIG. 1.
Figure 3:
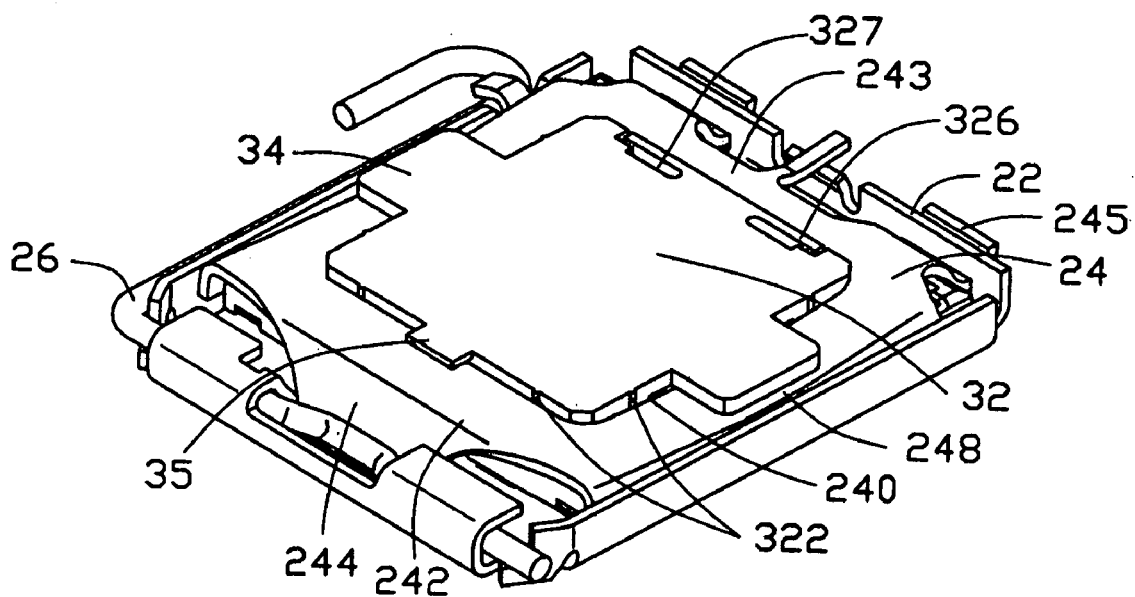
FIG. 3 is an assembled view of FIG. 1.
Figure 4:
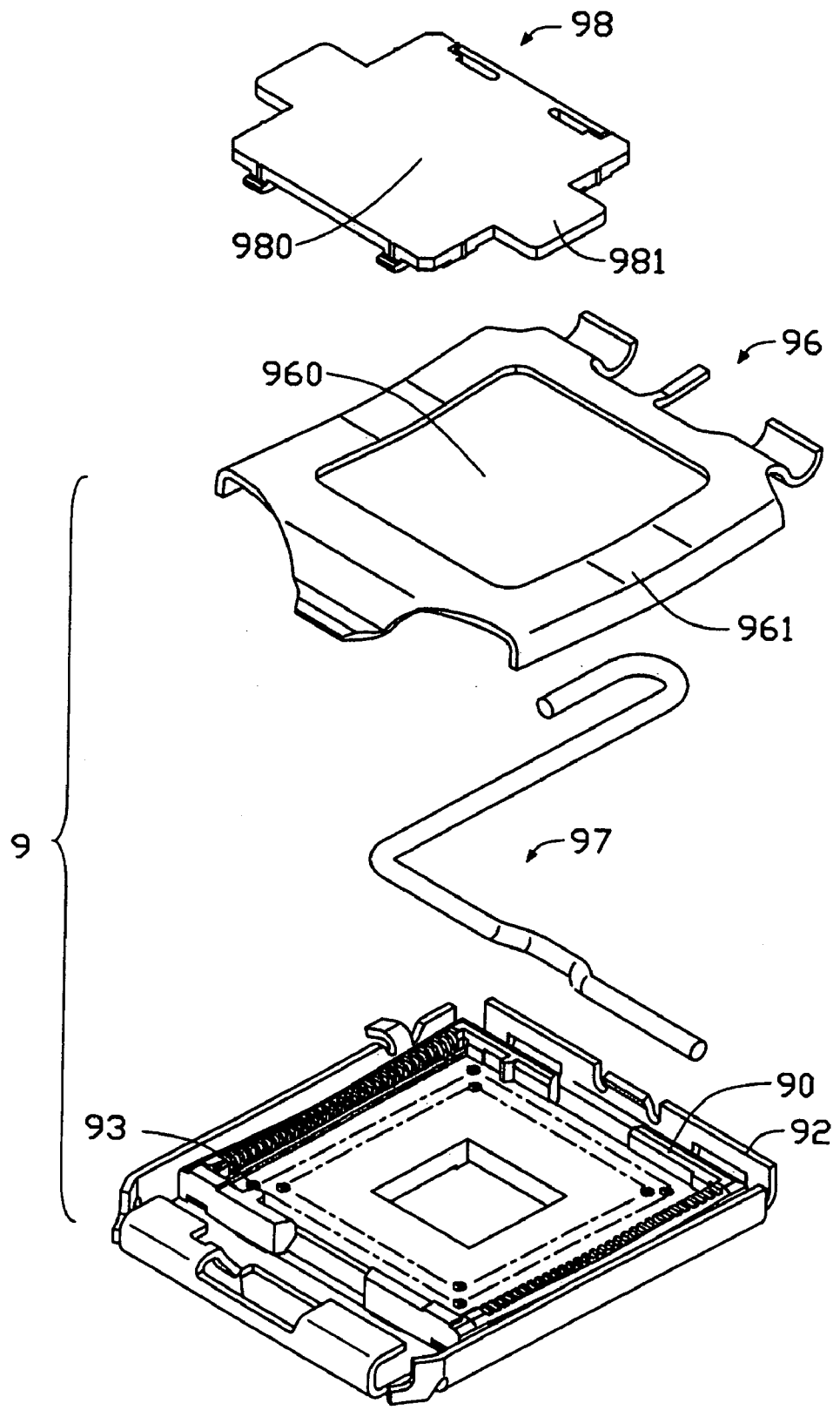
FIG. 4 is an exploded, isometric view of a conventional pick-up cap and an LGA connector on which the conventional pick-up cap is ready to be attached.
Figure 5:
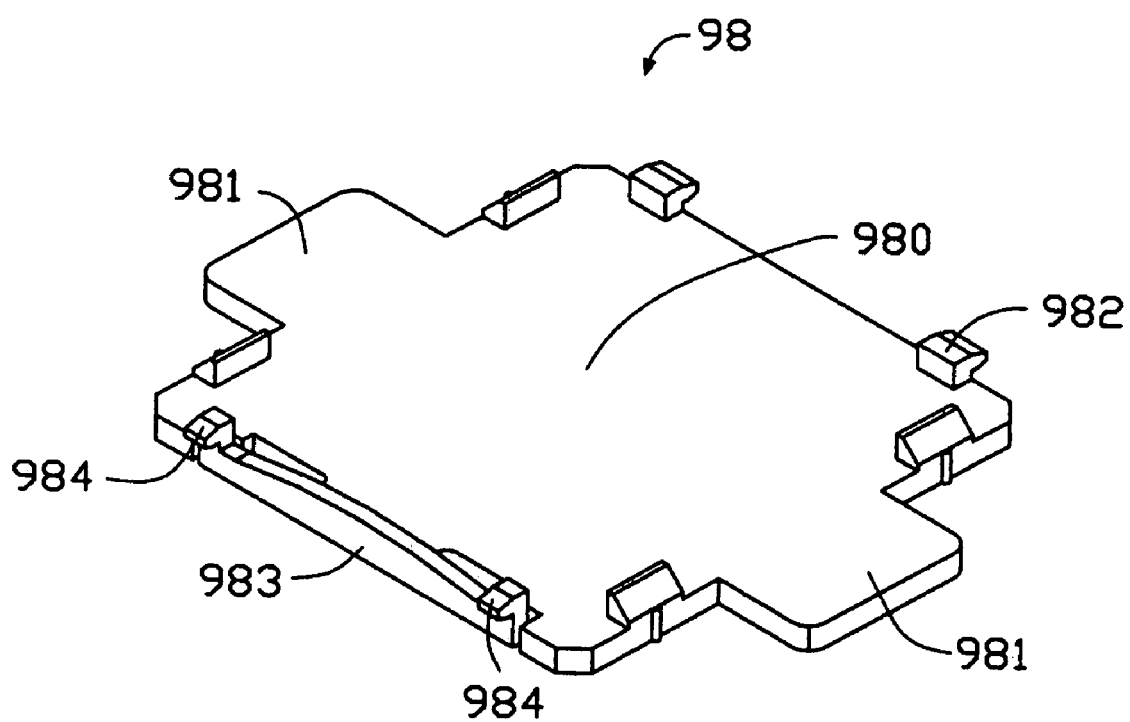
FIG. 5 is an inverted isometric view of the conventional pick-up cap of FIG. 1.
Figure 6:
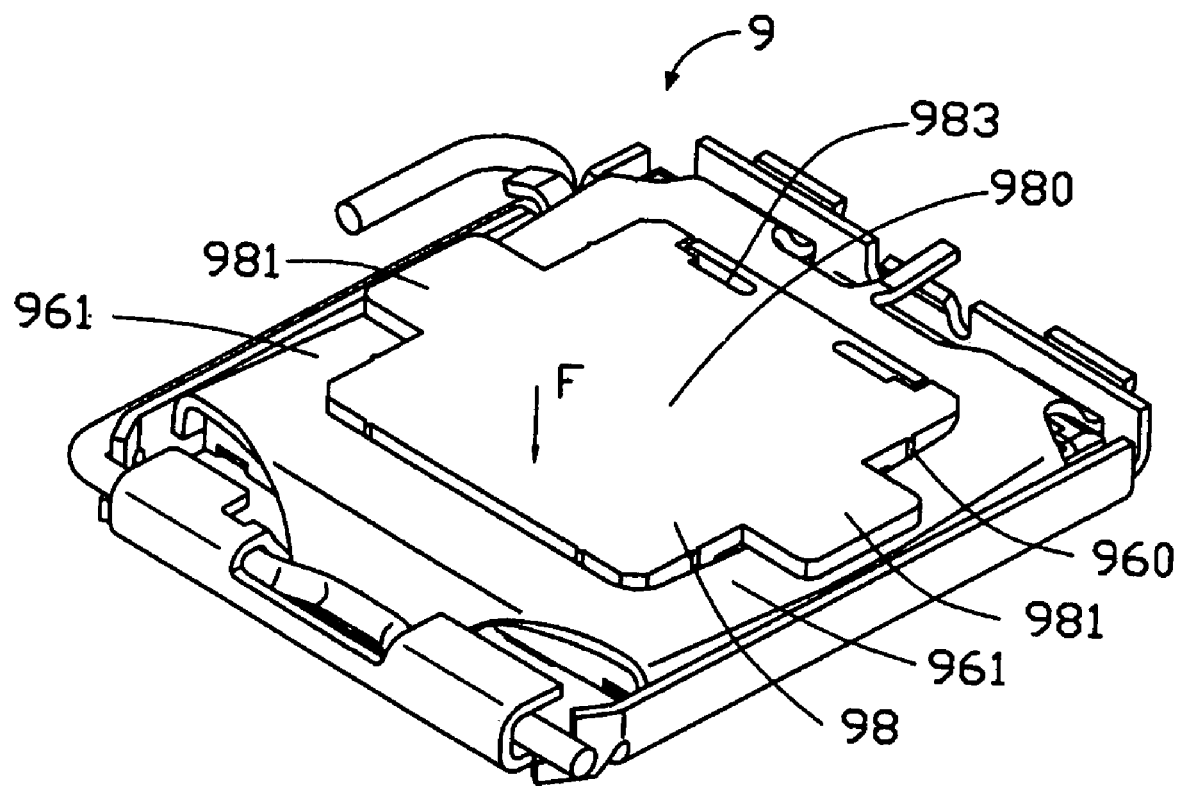
FIG. 6 is an assembled view of FIG. 4.

Referring to FIGS. 1–3, a pick-up cap 13 according to a preferred embodiment of the present invention is adapted to be attached with a land grid array (LGA) socket 12. It is appreciated that the pick-up cap 13 can be attached with other device, depending on the specific case.

In the preferred embodiment, the LGA socket 12 comprises an insulative housing 20 accommodating a plurality of conductive contacts 28, a stiffener body 22 retaining the housing 20, a load plate 24 pivotally assembled to one end of the stiffener body 22, and a load lever 26 assembled to the other end of the stiffener body 22.

The insulative housing 20 defines a recessed area 202. A plurality of passageways 200 are defined through the recessed area 202, and each passageway 200 accommodates a contact 28 therein, respectively.

The load plate 24 defines a rectangular opening 240 surrounded by two opposite pressing portions 241, a front beam 242 and a rear beam 243. A suppressing petiole 244 extends from the front beam 242, and a pair of spaced pivoting portion 245 extends from the rear beam 243 far away from the front beam 242.

The pick-up cap 13 defines a main body 32 and a pair of wings 34 extending from two opposite sides of the main body 32. The main body 32 is provided with a flat and smooth upper surface 320 for being picked up by a vacuum suction nozzle. The pick-up cap 13 defines a pair of wings 34 extending from two opposite sides of the main body 32 and further defines a tongue portion 35 extending from a side parallel to a line connecting the two wings 34. A plurality of first projections 325 extends from the side from which the tongue portion 35 extends. A resilient arm 326 extends from a side opposite to the tongue portion 35. A plurality of second projections 324 is defined on the resilient arm 326. The pick-up cap 13 defines a plurality of protrusions 322 extending from four sides thereof.

After the pick-up cap 13 is assembled with the load plate 24, the main body 32 of the pick-up cap 13 is interferingly received in the opening 240 of the load plate 24, and the two wings 34 abut against the pressing portions 241 of the load plate 24. The first and second projections 325, 324 cooperatively hook the load plate 24 via the opening 240. The resilient arm 326 is convenient for assembling the pick-up cap 13 with the load plate 24 by virtue of its flexibility. The tongue portion 35 of the pick-up cap 13 abuts against the front beam 242 or the rear beam 243. In the preferred embodiment, the tongue portion 35 abuts against the front beam 242. Thus, the pick-up cap 13 is attached with the load plate 24 and ready for being picked up by a vacuum suction nozzle.

When the vacuum suction nozzle presses on a middle portion of the main body 32 of the pick-up cap 13, the adsorption therebetween is stable and facile. When the vacuum suction nozzle presses on a portion adjacent to the resilient arm 326, the pick-up cap 13 will endure a torsion about an axis connecting the two wings 34. But this torsion will not tilt the pick-up cap 13 because of the hooking cooperation between the first projections 325 and the front beam 242 of the load plate 24. Therefore, when the nozzle presses on a portion adjacent to the resilient arm 326, the adsorption therebetween is still stable and facile. When the nozzle presses on a portion adjacent to the tongue portion 35, a torsion produced accordingly is counteracted by the cooperation between the tongue portion 35 and the front beam 242 of the load plate 24.

Furthermore, although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector assembly comprising:

a connector comprising an insulative housing accommodating a plurality of conductive contacts, a stiffener body retaining the housing, a load plate defining an opening and pivotally assembled to one end of the stiffener body, and a load lever assembled to the other end of the stiffener body;

a pick-up cap attached with the load plate, the pick-up cap defining a main body defining a smooth flat upper surface and four sides; a pair of wings and a tongue portion extending from three sides of the main body; a plurality of first projections extending downwardly from the main body; wherein the opening of the load plate is surrounded by two opposite suppressing portons, a front beam and a rear beam; wherein the two opposite wings abut against the pressing portions of the load plate; wherein the tongue portion abuts against the front beam of the load plate.

2. The electrical connector assembly as described in claim 1, wherein the main body of the pick-up cap defines a plurality of protrusions extending from four sides of the main body.

3. The electrical connector assembly as described in claim 1 further defining a resilient arm extending from a side opposite to the tongue portion.

4. The electrical connector assembly as described in claim 1, wherein the resilient arm defines a plurality of second projections.

5. The electrical connector assembly as described in claim 1, wherein the resilient arm hooks with the rear beam of the load plate.

6. The electrical connector assembly as described in claim 1, wherein the first projections are adjacent to the tongue portion.

7. An electrical connector assembly comprising:

a connector comprising an insulative housing accommodating a plurality of conductive contacts, a load plate assembled around one end of the housing for retaining an electronic package thereunder in the housing, said load plate defining an opening to expose said housing, a lever engagable with the load plate to hold said load plate in a horizontal position relative to the housing;

a pick up cap attached with the load plate to cover said opening, the pick-up cap defining a main body defining a smooth flat surface and plural sides; at least one hooked projection located on one side of the main body and latchably engaged with an underside of an edge area of said load plate around said opening, and a tongue portion located the same side of the main body and engaged with an upper side of said edge area so as to cooperate with said hooked projection to sandwich said edge area therebetween vertically.

8. The connector assembly as claimed in claim 7, wherein a deflectable hook projection formed on another side of the main body opposite to said side, is latchably engaged with an underside of another edge area of said load plate opposite to said edge area.

9. The connector assembly as claimed in claim 8, wherein said main body further defines a wing seated upon the load plate around said opening.

10. The electrical connector assembly as described in claim 1, wherein the main body of the pick-up cap is interferingly received in the opening of the load plate.

* * * * *